United States Patent [19]
Craford et al.

[11] 3,947,840
[45] Mar. 30, 1976

[54] INTEGRATED SEMICONDUCTOR LIGHT-EMITTING DISPLAY ARRAY

[75] Inventors: Magnus George Craford, St. Louis; Paul T. Bailey, Creve Coeur, both of Mo.

[73] Assignee: Monsanto Company, St. Louis, Mo.

[22] Filed: Aug. 16, 1974

[21] Appl. No.: 497,992

[52] U.S. Cl. .............. 340/324 M; 313/500; 357/17; 357/45; 358/59
[51] Int. Cl.² ............................................ G08B 5/36
[58] Field of Search ................ 357/17, 45; 313/500; 358/59; 340/324 M

[56] References Cited
UNITED STATES PATENTS

| | | | |
|---|---|---|---|
| 3,388,292 | 6/1968 | Burns | 340/324 M |
| 3,617,823 | 11/1971 | Hofstein | 357/45 X |
| 3,668,688 | 6/1972 | Schmersal | 340/324 M |
| 3,737,704 | 6/1973 | Grenon et al. | 357/45 X |
| 3,781,515 | 12/1973 | Morris et al. | 357/45 X |
| 3,783,353 | 1/1974 | Pankove | 357/17 |
| 3,807,036 | 4/1974 | Fischer | 29/577 |
| 3,807,037 | 4/1974 | Fischer | 29/577 |
| 3,813,587 | 5/1974 | Umeda et al. | 357/17 |
| 3,817,798 | 6/1974 | Jacobus et al. | 357/17 X |
| 3,846,193 | 11/1974 | Jacobus et al. | 357/17 X |

Primary Examiner—David L. Trafton
Attorney, Agent, or Firm—Peter S. Gilster

[57] ABSTRACT

An integrated LED display array wherein light is emitted and observed through a light-transmissive substrate, i.e., single crystal, which carries a plurality of optically isolated LED assemblies. Scattering of light from individual assemblies is prevented by an optically absorbing doped region which optically isolates each assembly. Light is generated at the back of the single crystal and viewed through the crystal. The LED assemblies, preferably multicolor, are directly mated to energizing electronic circuitry, e.g., a monolithic integrated circuit, via appropriate interconnections sandwiched between the two. The energizing electronic circuitry comprise an array of circuit elements which provide the energizing currents for respective ones of the LED assemblies.

15 Claims, 12 Drawing Figures

INTEGRATED SEMICONDUCTOR LIGHT-EMITTING DISPLAY ARRAY

BACKGROUND OF THE INVENTION

The present invention relates to visual display devices and, more particularly, to a composite integrated LED (light-emitting diode) display array, the LED devices being in planar array in a monolithic crystal wherein light is generated at a back surface of the crystal but transmitted through it and observed from the front surface of the crystal.

Heretofore, semiconductor light-emitting devices (whether of discrete, matrix, or array types) have been utilized in a fashion in which light was generated at or close to a "front" surface which is viewed by the observer. It has recently been proposed to construct LED devices from a transparent crystal in which light is generated at the "back" surface of the crystal but is transmitted through it and viewed from the "front" of the crystal. It is herein proposed to utilize this concept in a composite semiconductor array which includes an integrated circuit. The array disclosed is of an X–Y addressable configuration, i.e., a solid state planar array.

In the past, a variet of devices for non-permanent visual presentation of information has been available. Perhaps one of the most widely used and accepted visual display devices is the cathode ray tube. While the cathode ray tube has served admirably in many dieverse applications, it does suffer many disadvantages which limits its future use in many applications. These include high-voltage requirements (usually of the order of 15,000 volts or more) and x-ray and radio frequency emissions which are attendant to such high voltages requiring shielding in order to reduce radio-frequency interference. In addition, cathode ray tubes are expensive owing to their complexity of manufacture and their relatively short lifetime requireing periodic replacement. The low light output of cathode tube displays requires care to prevent glare from the ambient surroundings from preventing the readability of the display. Even under ideal conditions, cathode ray tube displays being analog in nature have poor resolution with accuracies achievable only to about 2%. Furthermore, the large size and weight and the nonruggedness of the cathode ray displays prevent their use in many environments where space is at a premium and rugged, dependable construction is a prerequisite.

Another type of display is the so-called plasma discharge (or simply "gas discharge") display, in which gas between planar electrodes in a gas-filled envelope is excited by voltages across the electrodes provides emission of light. Such devices require relatively high energizing voltages, are somewhat bulky, and have limited lifetime. Because of their higher energizing voltages, they are not directly compatible with semiconductor circuitry of the type employed in integrated circuits.

These and other type of displays are described, and their relative merits noted, in the article entitle "Circuit/System Building Blocks" by Lapidus, G., in *IEEE Spectrum*, Vol. 11, No. 1, January, 1974, p. 54.

Recently, semiconductor light-emitting diodes ("LED's") and other semiconductor light-emitting devices have been developed. While LED's were predicted to lend themselves to fabrication in a form amenable to X–Y scanning, a simple X–Y matrix of solid-state light-emitting devices has many drawbacks. One major disadvantage to X–Y scanning of a large array is that high-peak currents are required for very short periods of time. Further, where a large number of LED's are simply arrayed, as in the form of an integrated semiconductor display chip, optical crosstalk often occurs, i.e., a manifestation in which an LED which is energized scatters light to adjacent non-energized LED's, making the latter appear to be energized, or reducing the contrast, resolution and general optical quality of any image displayed by the array. Moreover, the use of LED's in a multicolor display array presents formidable problems, particularly as to the difficulties of providing electrical interconnection between electronic circuit elements (e.g., memory and drive circuits) and the individual LED's. Prior art approaches have not satisfactorily solved such problems and have not facilitated the desirable integration of the display array with integrated circuitry for energizing the LED's.

SUMMARY OF THE INVENTION

Among the several objects of the invention may be noted the provision of an improved LED display array; the provision of such an array which is of planar configuration having a plurality of LED's arrayed in rectangular row-and-column format; the provision of such an array which is multicolor and which permits mixed color displays; the provision of a composite integrated circuit LED display array having an LED array sandwiched or integrally interconnected with a monolithic integrated circuit for energizing the LED's of the array; the provision of such display arrays which provide high contrast, brightness and resolution and are substantially free of optical crosstalk; and the provision of such display arrays which require only low voltages and currents for operation.

Briefly, a composite integrated circuit LED display array of the invention comprises an LED array formed in a light-transmissive monolithic planar substrate, the arrayed LED devices of this array being adapted when energized to emit light at the back surface of the substrate. The LED devices, which may be multicolor, are optically isolated from one another by a light-absorbing doped region between the devices which absorbs light emitted by the individual devices. The LED array is useful when integrally associated and interconnected with a monolithic integrated circuit array of circuit elements corresponding to and adapted for energizing the respective LED devices. The electrical interconnection is effected by interconnection means sandwiched between the LED and circuit arrays. The circuit elements are selectively operable, as by X–Y addressing, for energizing the LED devices. The LED devices emit light at the back surface of the substrate but the light is observed at the front surface of the substrate.

Other objects and features will be in part apparent and in part pointed out hereinbelow.

BRIEF DESCRIPTION OF THE DRAWINGS

Corresponding reference characters indicate corresponding parts throughout the several view of the drawings.

DETAILED DESCRIPTION OF THE INVENTION

Figure 1A:
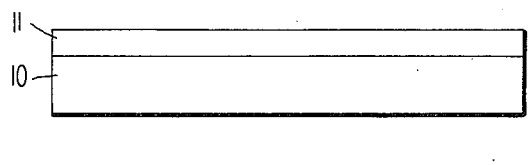
FIGS. 1A to 1H are cross-sectional views illustrating a process of forming an array of optically isolated multicolor LED assemblies in accordance with the present invention.

The formation of an array of optically isolated, multicolor LED's in accordance with the present invention will firstly be illustrated in detail with reference to FIGS. 1A to 1I.

The preferred processing sequence exemplified can be summarized as follows:

1. Epitaxial growth of a single crystal layer, in which green LED's are to be formed, on a single crystal substrate.
2. Diffusion of optical isolation zones into the epitaxial single crystal layer and substrate.
3. Formation of red LED's in the epitaxial single crystal layer.
4. Formation of green LED's in the epitaxial single crystal layer.
5. Framing the individual LED assemblies of the red and green LED's.
6. Defining LED assembly mesas.

The completed array is then directly mated to a monolithic integrated circuit, which can be considered step 7, at the light generating side thereof.

The fabrication sequence will now be illustrated in detail.

1. GROWTH OF THE EPITAXIAL SINGLE CRYSTAL LAYER, IN WHICH THE GREEN LED'S ARE TO BE FORMED ON THE SINGLE CRYSTAL SUBSTRATE.

In the following discussion the LED array will be exemplified with reference to the formation of a module comprising 16 LED assemblies (in 4 × 4 rectangular format, i.e., with four rows and four columns) for purposes of later brevity in describing the mating energizing electronic circuitry. As will be apparent to one skilled in the art, however, the LED array of the present invention can be produced in the monolithic state containing a substantially greater number of LED assemblies as desired, or, alternatively, a number of smaller replaceable LED modules can be joined to provide a quasi-monolithic array. Thus, the configuration is such that the LED assemblies are arranged in rows and columns in a rectangular format of the type disclosed in copending, co-assigned U.S. application Ser. No. 498,142 filed in the name of P. T. Bailey et al. on Aug. 16, 1974 entitled Integrated Semiconductor Light-Emitting Display Array Having LED's and Selectively Addressable Memory Elements, hereby incorporated by reference.

The preferred substrates are bulk-grown, single-crystal III/V compounds (i.e., having elements selected from atomic groups III and V) having n-type conductivity with GaP doped with Te or Se being most preferred.

Feasible alternative substrates are sapphire and spinel, both of which have a sufficiently wide band gap.

Feasible alternative dopants include the group VI materials such as S and the Group IV materials such as Si and Ge.

The doping level in the substrate should not be so high as to interfere with the light transmission, since viewing is through the substrate, but should be sufficiently high to permit adequate current transmission through the substrate to appropriate contact(s) when such is desired. These two parameters can obviously be varied widely depending upon user requirements, and thus the exact doping level is not overly critical. Usually substrate doping levels of about $10^{16}$ to about $10^{18}$ atoms/cc are preferred.

The substrate thickness is not overly critical from the viewpoint of device performance, and is established by a balance of the following factors: thicker substrates are more easily handled without fear of breakage; thinner substrates provide the benefits of lower cost and better light transmission. Typically, the substrate will be on the order of 6 mils or thicker.

The epitaxial single crystal layer grown on the substrate in which the green LED's are to be formed is preferably nitrogen-doped single crystal GaP, as the isoelectronic trap nitrogen is an efficient light-emitting center. This growth step can be carried out by vapor or liquid epitaxial techniques, but vapor epitaxial techniques are preferred.

The vapor epitaxial growth techniques disclosed in co-assigned U.S. Pat. No. 3,218,205 (R. A. Ruehrwein) and U.S. Pat. Application Ser. No. 313,227 (A. S. Epstein and W. O. Groves), filed Dec. 8, 1972, and now abandoned, entitled "Gallium Phosphide Light Emitting Diodes" or the liquid epitaxial techniques disclosed in U.S. Pat. No. 383,646,406 (Logan et al.) can be used with success to form this nitrogen-doped GaP layer.

The thickness of the nitrogen-doped, single crystal GaP layer is not overly important so long as it is sufficiently thick to contain the LED junctions. Typically, thicknesses of the order of 10 microns to 6–8 mils will be used, with most preferred thicknesses being ½ mil to about 3 mils for ease of fabrication.

The nitrogen-doping level is most preferably $10^{18}$ to $5 \times 10^{20}$ atoms/cc for optimum green LED performance.

A specific exemplification of the module at this fabrication step is illustrated in FIG. 1A where an n-type Te or Se doped GaP substrate 10 [dopant concentration $1 \times 10^{17}$ atoms/cc] 15 mils thick has formed thereon a 3 mil thick layer 11 of nitrogen-doped GaP [dopant concentration $1 \times 10^{19}$ atoms/cc]. The vapor epitaxial technique described in U.S. Pat. application Ser. No. 313,227 referenced above was used to form the nitrogen-doped single crystal GaP layer.

If desired, "graded" substrates, for example, graded from GaAsP to GaP, can be used. Techniques for forming such graded substrates are well known in the art.

Further, if desired, it is possible to delete the nitrogen-doped single crystal epitaxial layer and nitrogen-dope directly into the substrate, thereby forming a region equivalent to the grown nitrogen-doped epitaxial layer. Known techniques can be used to practice this modification of the invention. It is preferred, however, to use the nitrogen-doped single crystal epitaxial layer for purposes of ease of process control.

2. DIFFUSION OF OPTICAL ISOLATION ZONES

Following the growth of the nitrogen-doped, single crystal GaP layer, optical isolation zones are diffused into the spaces between the individual LED assemblies which will later be formed.

The preferred optical isolation diffusion impurity is zinc. Feasible alternatives which illustrate a suitable absorption coefficient are, e.g., the group II metals such as Cd and Be, but these suffer from the faults of inferior optical properties and high toxicity, respectively.

To achieve optimum optical isolation of the individual LED assemblies, the zinc diffusion is preferably performed to a concentration in excess of about $10^{18}$ atoms/cc, but less than about $10^{20}$ atoms/cc.

The volume occupied by the optical isolation diffusion is not overly important, subject to two precautions: the optical isolation diffusion should not contact the junctions of the LED's and lateral optical crosstalk will potentially occur unless the optical isolation diffusion extends vertically through the substrate and nitrogen-doped, single crystal GaP layer. If some optical crosstalk is acceptable, the optical isolation diffusion need not extend completely through the substrate.

The optical isolation diffusion essentially absorbs light generated in one LED assembly which is scattered by the transparent substrate, preventing optical crosstalk between separate LED assemblies.

Figure 1F:
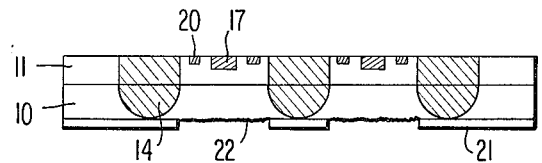
Figure 1B:
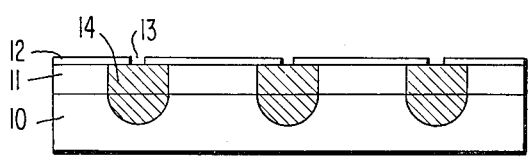

In a specific exemplification of the module at this state of fabrication given with reference to FIG. 1B, a silicon nitride masking layer 12 which is resistant to diffusion of zinc is formed on the nitrogen-doped, single crystal GaP layer 11 and a thin window 13 etched or scribed therein to expose the nitrogen-doped, single crystal GaP layer 11.

Since the diffusion of zinc into the GaP substrate 10 is essentially isotropic, the window 13 can essentially be viewed as a line or infinite point diffusion source, the zinc diffusing equally in all directions to provide the semicircular shape shown by 14 in the cross-sectional view presented in FIG. 1B.

Since the face of the substrate 10 remote from nitrogen-doped, single crystal GaP layer 11 is later to be lapped in this exemplification, the diffused zinc regions 14 extend only about 7 mils below the surface of the substrate 10, are spaced 45 mils center-to-center and have a maximum width of about 15 mils at the nitrogen-doped, single crystal GaP layer 11.

Diffusion is at 800°–900°C. for about 250 hours using $ZnP_2$ as the zinc source. Typically, diffusion will be at such temperatures for about 100 to about 400 hours to perform the optical isolation diffusion. The diffused zinc region 14 (dopant concentration~$10^{19}$ atoms/cc) have an absorption coefficient of about 40 $cm^{-1}$, compared with that of the "undiffused" substrate (dopant concentration~$10^{17}$ atoms/cc) absorption coefficient of about 0.5 $cm^{-1}$, for the light generated from the red and green LED's to be formed.

Figure 1G:
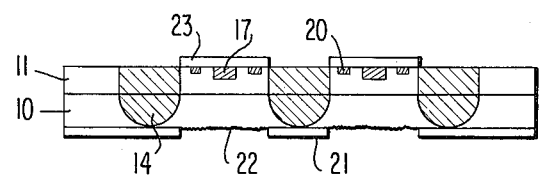
Figure 1C:
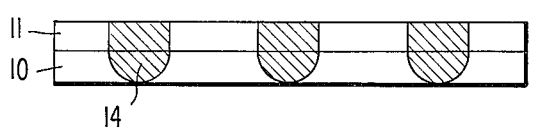

The substrate 10 is then lapped to the zinc optical isolation regions 14, as shown in FIG. 1C. This lapping step is optional, and if used can occur at subsequent processing stages.

The silicon nitride mask 12 is removed subsequent to the zinc diffusion.

If the substrate 10 is to serve as a common conductor for all LED's so that only one other connection is required to each LED, the heavy zinc isolation zones 14 reduce the efficiency of the substrate in this regard, but a later described metal mask 18 applied when the LED assemblies are framed overcomes this problem.

3. FORMATION OF RED LED'S IN SINGLE CRYSTAL LAYER

The red LED's are preferably formed in the nitrogen-doped, single crystal GaP layer from a binary or ternary single crystal material by a liquid or vapor phase epitaxial growth technique. Liquid epitaxial techniques are preferred. Exemplary of such single crystal materials are GaP, GaAsP, GaInP, GaAlP, GaAlAs, InAlP, AlS, and the like. Zinc and oxygen doped single crystal GaP is most preferred.

Suitable epitaxial growth techniques are disclosed in Proceedings of the IEEE, Vol. 61, No. 7, "Vapor Phase Epitaxial Materials for LED Application", M. G. Craford and W. O. Groves, page 862.

The thickness or depth of the red LED is not overly important so long as the requisite junction is formed in the nitrogen-doped, single crystal GaP layer. Typically a fraction of a mil to a few mils suffices.

The zinc doping level is preferably about $10^{16}$ to about $10^{20}$ atoms/cc and the oxygen doping level is preferably about $10^{16}$ to about $10^{18}$ atoms/cc.

A specific exemplification will now be given with reference to FIG. 1D, where the upper surface of the nitrogen-doped GaP layer 11 and zinc optical isolation regions 14 are first masked with a silicon nitride mask 15 and parallel grooves 16 etched in the nitrogen-doped, single crystal GaP layer 11 using aqua regia. Single crystal zinc and oxygen doped GaP 17 which is to form the red LED are then grown in the grooves 16 using the liquid epitaxial technique disclosed by R. H. Saul et al, "GaP Red Electroluminescent Diodes With an External Quantum Efficiency of 7%", Appl. Phys. Lett., Vol. 15, pp 229–331, October, 1969.

Grooves 16, which are filled with zinc and oxygen doped GaP, are 3 mils wide, about 1.5 mils deep and spaced 45 mils center-to-center. The zinc and oxygen doping densities are about $1 \times 10^{18}$ and $1 \times 10^{17}$ atoms/cc, respectively.

The module is then generally lapped to remove the silicon nitride mask 15 and to ensure the site of the red and green LED's next formed will constitute a flat back surface of the crystalline substrate. The wafer is not shown at this stage in the attached drawing in a separate figure.

4. FORMATION OF GREEN LED'S

The green LED's are formed by a diffusion into the epitaxially grown single crystal layer adjacent the red LED's. While not mandatory, to achieve good color mixing and color uniformity each green LED is preferably made in two halves which flank a red LED. These two halves are subsequently electrically joined to behave as one green LED, for example, by horseshoe or U-shaped metallurgy which connects both halves of the green LED.

Most preferably, the two LED halves are simultaneously formed by a zinc diffusion into the nitrogen-doped, single crystal GaP layer through an appropriate mask.

Figure 1H:
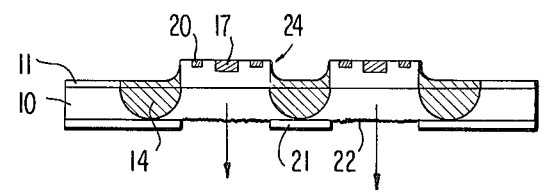
Figure 1D:
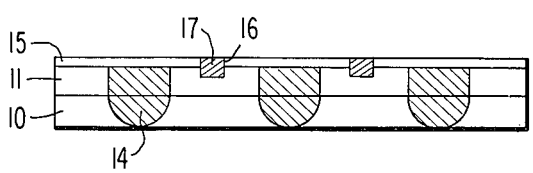
Figure 1I:
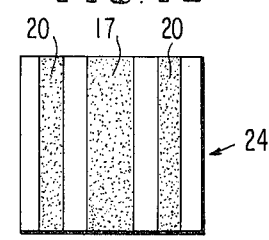
FIG. 1I is a top view of a certain LED assembly mesa.
Figure 1E:
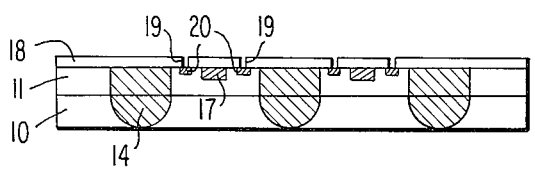

In a specific exemplification given with reference to FIG. 1E, a silicon nitride mask 18 is formed over the module and windows 19 etched therein. Thereafter, using zinc metal as the source, zinc is diffused at 875°C. for 15 minutes to a depth of 5~10 microns into the nitrogen-doped, single crystal GaP layer 11 to provide green LED "halves" 20 flanking red LED's 17.

The green LED halves are each 1.5 mils wide and are spaced from the red LED 2 mils.

The silicon nitride mask 18 is removed after the zinc diffusion to form the green LED's.

5. FRAMING THE INDIVIDUAL LED ASSEMBLIES

Since the light is viewed through the substrate, i.e., at its front surface, a conductive metal mask 21 is evaporated onto the side of the GaP substrate remote from the LED's, the mask defining open frames centered on each red-green pair of LED's on the other side of the wafer, as is shown in FIG. 1F.

In a specific exemplification given with reference to FIG. 1F, the frames 21 are aluminum and 18 × 18 mils on 45 mil centers above the LED assemblies. As earlier indicated, the metal mask 21 can function with the substrate 10 as a common conductor for all LED's so that only one additional connection is required for each LED.

The exposed GaP surface within each frame 18 is then preferably sandblasted in order to render the surface a diffusing surface. When the light from the two LED's strikes, the surface becomes a lambertian light-emitting surface, 18 × 18 mils, whose color varies from pure red, through yellow, to pure green, depending on the relative outputs of the pair of LED's behind the frame. Following sandblasting, the lambertian surface is generally indicated by 22 in FIG. 1F.

Both framing and sandblasting are optional, but preferred operations.

As alternatives, the frame could be replaced by a transparent thin film of tin oxide or a metal mesh, or, conductive metallurgy can be provided on the side of the LED array which contains the LED's.

6. DEFINING LED ASSEMBLY MESAS

The final step in fabricating the monolithic LED array is a masking and etching step to define LED assembly containing mesas. This step serves two purposes: Firstly, it defines the size of the red LED's and electrically isolates the red LED's in the same groove from one another; secondly, it can assist to reduce crosstalk between one red-green pair of LED's in an individual LED assembly and adjacent similar pairs, and at the same time channel the light into the desired forward direction through the substrate. This step in the fabrication procedure of the module is illustrated in FIG. 1G, where a suitable mask 23 of silicon nitride is shown applied over the LED assembly, leaving the remainder of the surface exposed.

In a specific exemplification, etching is with aqua regia to a depth of about 2.5 mils beneath the original nitrogen-doped, single crystal GaP surface, providing a module as shown in cross-section in FIG. 1H after mask 23 has been removed, the mesas being generally indicated by numeral 24. The direction of light emission is indicated by arrows thereon.

An upper view of an individual LED assembly mesa is shown in FIG. 1I.

The mesa surface is about 10 mils in length parallel to the LED's and about 12 mils in width perpendicular to the LED's.

The green LED's emit light peaking between 550 and 560 nanometers and the red LED's emit light of equal brightness with a broad peak near 690 nanometers.

The reduced junction area, with respect to the front-face emitting area (within the frames 18), results in a higher current density in the LED for a given surface brightness. This is desirable, particularly for the case of the green emitting diode. For example, if a full 18 × 18 mil LED were formed and operated at 30 ft.-lamberts surface brightness, low current densities are used which are in the diode performance region where light output is superlinear with current density, whereby power is wasted and heat unnecessarily generated.

The smallest possible LED size is desired so that the best color mixing will result and so that the total LED area subtends the smallest possible solid angle at the diffusing front-face emitter, thus reducing loss of light at the front-face.

The lower limit on the LED assembly size (total LED active area) is primarily established by the fact that if the assembly size is too small the current density is not in the linear operating region but in the region where light output varies sublinearly with current density. Sublinear operation can be determined using techniques available to one skilled in the art.

The monolithic LED array thus fabricated is composed of many integrated red-green-red LED assemblies in modular wafers of GaP, which can provide not only green, red and yellow radiation, but different shades of red and green, depending on the green-red mixing ratio.

Immediately behind each LED assembly will be an integrated circuit consisting of a flip-flop memory, a drive transistor plus an AND gate, the whole being integral with the monolithic LED array.

The overall integration of the monolithic LED array mated to integrated memory-drive circuitry at the light generating side of the array enables several substantial benefits to be realized as compared to prior art large area displays.

First, a simple array suffers from the major drawback that extremely large peak currents are required for very short time durations, e.g., assuming 1 million LED's requiring 2 mA to give 30 ft. L and a frame rate of 10 Hz, the pulse current will be 2,000 A and the pulse duration 100nS.

The display array of the present invention enables these requirements to be substantially decreased and the radio frequency interference to be reduced by the use of a display array comprising a monolithic LED array with memory-drive circuitry mated to the light generating side, the whole being addressed in parallel or series parallel fashion.

The LED-with-memory combination also contains a minimum of wire connections and bonds. For example, assuming a modular GaP wafer with 16 LED assemblies (4×4), all LED assemblies can share one connection (to the substrate) which is common. The second connection will be to the energizing electronic circuitry so that the total display will have random write and erase features and will display data identically regardless of the position on the display or the number of modules involved.

The following discussion exemplifies appropriate integrated memory drive circuitry as briefly discussed above.

The energizing electronic circuitry is basically a MOS integrated circuit chip which supplies decoding, memory and LED drive capability. The chip is organized in a four-by-four array of 16 total display elements, each with three color capability.

Figure 2:
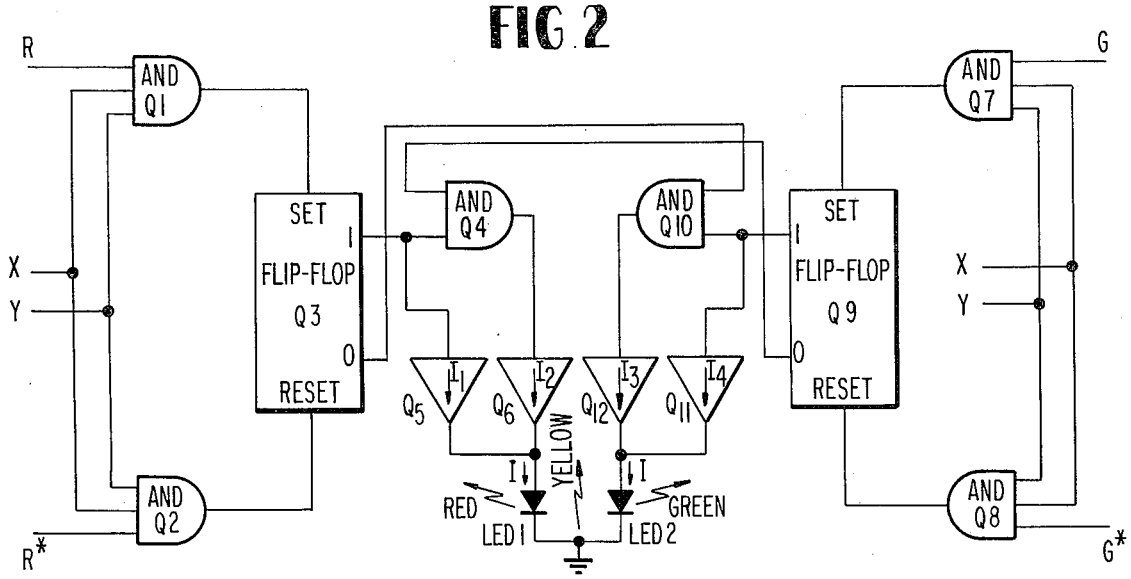
FIG. 2 is a simplified schematic circuit diagram illustrating a combination of certain circuit elements and LED's in accordance with the present invention.

The electronics for a multicolor display element is shown in FIG. 2. The element has the following states: (a) Off, (b) RED, (c) GREEN, and (d) YELLOW.

The electronics contains individual circuits to generate the color RED or GREEN, and combines both to generate the color YELLOW.

Logic elements $Q_1$, $Q_2$, $Q_7$ and $Q_8$ are AND circuits. The common inputs to these elements are the element select signals X and Y, which are decode outputs of 1/16 Word Decoders in the associated display module electronics. The other inputs R, R*, G and G* contain the "Action" information.

When inputs X, Y and R are coincident in time at the logical AND gate $Q_1$, Flip-Flop $Q_3$ is set to the logical ONE state. In the event that Flip-Flop $Q_9$ was not previously set and in the absence of G action bit at this decode time, Flip-Flop $Q_9$ will be in the reset state. For this condition, LED 1 (RED) will be driven by a current I equal to $I_1 + I_2$ from the current sources $Q_5$ and $Q_6$. Current source $Q_5$ is driven by the 1 output of $Q_3$ and current source $Q_6$ is driven by the logical AND gate $Q_4$ whose true inputs are the 1 state of $Q_3$ and 0 state of $Q_9$. Hence the color RED is produced.

If Flip-Flop $Q_9$ was previously set or the G action bit is present at this decode time, Flip-Flop $Q_9$ will be in the set state. This condition together with $Q_3$ being set simultaneously will inhibit the outputs of both $Q_4$ and $Q_{10}$ allowing current source $Q_5$ to drive $I_1$ current through LED 1 and $Q_{11}$ to drive $I_4$ current through LED 2. Since both the RED and GREEN diodes are driven, the YELLOW color will be produced. It should be noted that the color YELLOW is achieved without pulse or power modulation techniques and memory capability is exhibited.

The color GREEN is produced in an identical way as the color RED using elements $Q_7$ through $Q_{12}$ with LED 2.

The brightness of the three colors can be made equal by proper design of the currents $I_1$, $I_2$, $I_3$ and $I_4$.

Action bits R* and G* are required to reset $Q_3$ or $Q_9$ by the logical AND gates $Q_2$ or $Q_8$ at an element decode time. The reset action extinguishes the respective LED 1 or LED 2.

The Flip-Flops $Q_3$ and $Q_9$ operate as memories since they retain their states until altered during a decode time by any of the inputs R, R*, G, G*. It will be apparent that decode time is defined by the presence of inputs X and Y.

Conventional thick oxide, P-channel MOS technology is capable of holding ON resistance variations to about ± 30% which is an order of magnitude higher than can be allowed for. The "brute force" approach to this problem would be to insert an accurate thin film resistor in series with the uncertain FET resistance. Normal device geometry for driver transistors give ON resistances in the neighborhood of 300 ohms, so a 3,000 ohm resistor would be necessary to "swamp out" the FET variations. This resistance would dissipate 5.1 mw at 1.3 ma, or several times the power in the LED. (Larger FET devices can be built, the penalty being lower yield).

Figure 3:
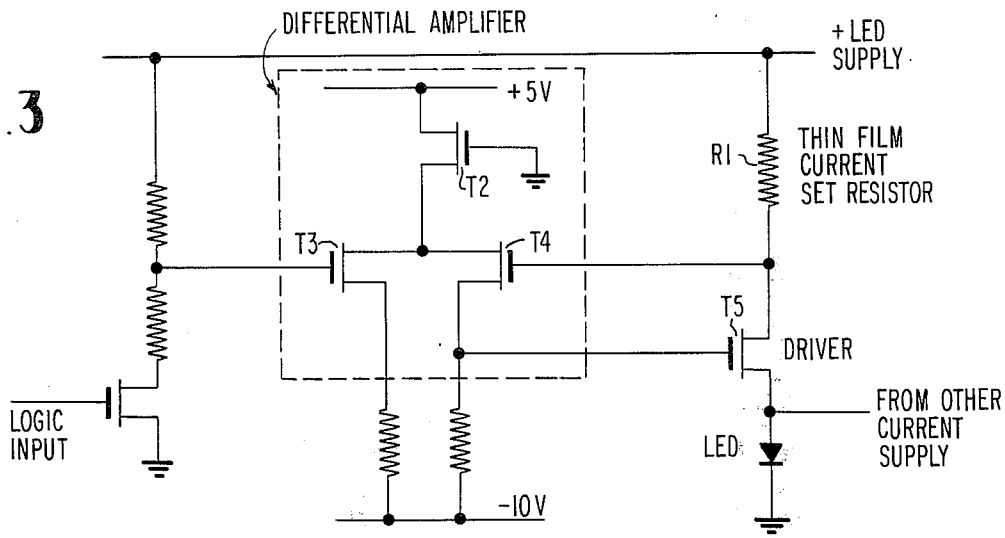
FIG. 3 is a simplified schematic circuit diagram illustrating a LED current source in accordance with the present invention used in the combination illustrated in FIG. 2.

The problem of large ON resistance variations is solved by including relatively simple current sources alongside the memory elements. These current sources are shown as $Q_5$, $Q_6$, $Q_{11}$ and $Q_{12}$ in FIG. 2 and are shown in detail in FIG. 3. Here, the voltage drop across an accurate thin film resistor $R_1$ is sensed by a differential amplifier comprising transistors $T_2$, $T_3$ and $T_4$ and an analog error signal is sent to the driver transistor $T_5$. The voltage required across the current set resistor (and thus the power dissipation) is lower than the "brute force" approach gives and only enough voltage need be developed to be sensed unambiguously by the differential amplifier. For a device compatible with the earlier exemplified monolithic LED array, in the present design this voltage could be 650 mv.

Should more than three discrete colors be required in a LED assembly, for example, RED, YELLOW-RED, YELLOW, YELLOW-GREEN, and GREEN, it would be necessary to add an additional memory, AND gate and current source element. The addition of this extra element would provide for four additional states where the remaining two might be used for additional brightness to one of the above colors for added emphasis.

If BLUE LED's are utilized, the additional element above will be needed for controlling this LED and would give the following color capabilities: RED, GREEN, BLUE and various mixes of these three colors.

Figure 4:
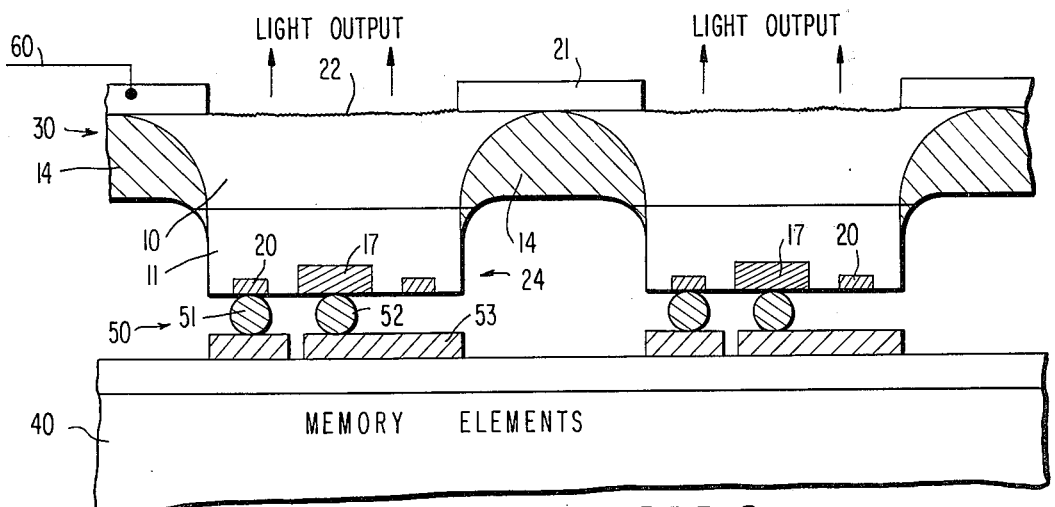
FIG. 4 is a cross-sectional view of a composite integrated circuit LED display array in accordance with the present invention.

An exemplification of a light-emitting display array according to the invention is shown in cross-section in FIG. 4 where the numerology of FIG. 1 is used to identify like elements. In this array, however, the nitrogen-doped single crystal layer 11 is shown removed in all areas other than mesa areas. This is accomplished by extending the etch time for mesa formation.

The array is a sandwich structure comprising a monolithic array of light-emitting devices 30 and a monolithic silicon large-scale integrated circuit 40 with a multi-layer metallization and interconnections generally indicated at 50 sandwiched between the two. The monolithic silicon circuit comprising the array of memory elements can be mounted on a metallic heat sink to provide both rigidity and even thermal distribution, if desired.

A characteristic feature of this invention resides in the fact that the light is generated at the back of the crystal of the array 30, or adjacent the interconnections 50 with the monolithic silicon circuit 40, with the light generated by the LED assemblies being observed from the front surface as indicated by the arrows in the drawing.

Spherical or hemispherical metal contacts 51 and 52 are preferably used between the pads 53 of multilayer metallization 50 and the individual green and red LED's, respectively, to provide good electrical contact between the LED's and their associated memory elements in the monolithic silicon circuit 40. U-shaped surface metallurgy (not shown) joins the two green LED halves 20. This sandwiched construction and electrical interconnection, involving what is referred to in the art as flip-chip bonding, permits an extremely compact fabrication of the integrated semiconductor display array according to the invention.

Contact 60 to the framing mask 18 is also shown in FIG. 4 to complete the electrical circuitry. Alternative techniques for completing the circuitry have been earlier discussed. A further alternative would be to form LED's only in every other mesa and to use the mesa free of LED's for the same purpose as contact 60. In this case, such mesas could be mated to pads 53 using a spherical contact similar to spherical contacts 51 and 52.

Alternatively, such mesas could be directly mated to the pads 53, but in such a case it is necessary to insure these mesas extend further from the substrate than the LED containing mesas.

Although the above discussion has been in terms of green and red light-emitting LED's, it should be clear that, if desired, LED's generating other colors can be formed if desired, e.g., nitrogen-doped GaAsP (orange, yellow), Zn, O and nitrogen-doped GaP (yellow) and the like.

Appropriate addressing means which can be used in combination with the display arrays of the present invention is disclosed in copending, co-assigned U.S. application Ser. No. 497,991, filed in the name of A. G. Findlay on Aug. 16, 1974 and entitled "Integrated Semiconductor Light-Emitting Display Array," hereby incorporated by reference.

In view of the foregoing, it will be seen that the several objects of the invention are achieved and other advantages are attained.

As various changes could be made in the constructions herein described without departing from the scope of the invention, it is intended that all matter contained in the foregoing description or shown in the accompanying drawings shall be interpreted as illustrative rather than in a limiting sense.

What is claimed is:

1. A composite integrated circuit LED display array comprising:
    a light-transmissive monolithic planar substrate of a single III–V crystal including a plurality of LED devices carried in the body of said substrate and forming an array of LED devices, each of said LED devices being adapted when energized to emit light at the back surface of said substrate, said LED devices being optically isolated from one another, the optical isolation being affected by a light-absorbing doped region between said LED devices, said doped region being adapted to absorb light emitted by the individual LED devices, each of said LED devices being constituted by at least one diode having a separate p-n junction at which said light is radiated, said junction being at the back surface of said crystal, said light being transmitted through said crystal for being observed at the front surface of said crystal;
    a monolithic integrated circuit array of circuit elements corresponding to and adapted for energizing respective ones of said LED devices, said integrated circuit array being adjacent the back surface of said crystal; and
    interconnection means sandwiched between said arrays for providing electrical interconnections between respective ones of said LED devices and circuit elements at said back surface, said circuit elements being selectively operable for independently energizing corresponding ones of said LED devices to emit light at said back surface, said light being transmitted through said substrate for being observed at the front surface of said substrate.

2. A composite LED display array as set forth in claim 1 wherein said substrate is a monocrystalline III/V compound.

3. A composite LED display array as set forth in claim 2 wherein said substrate comprises a monolithic crystal of GaP doped to have n-type conductivity.

4. A composite LED display array as set forth in claim 3 wherein said GaP is doped with Te or Se.

5. A composite LED display array as set forth in claim 3 wherein said LED devices are formed in a single crystal nitrogen-doped GaP epitaxial layer on said substrate of GaP.

6. A composite LED display array as set forth in claim 5 wherein said LED devices are adapted to emit light of a plurality of colors, there being at least one LED for each color.

7. A composite LED display array as set forth in claim 6 wherein said LED devices comprise a plurality of LED assemblies, each assembly comprising at least one green LED and at least one red LED.

8. A composite LED display array as set forth in claim 7 wherein the red LED comprises a p-n junction formed by a zinc and oxygen doped GaP area at the surface of said nitrogen-doped GaP epitaxial layer.

9. A composite LED display array as set forth in claim 8 wherein each LED assembly comprises a central red LED flanked by a green LED.

10. A composite LED display array as set forth in claim 9 wherein the green LED comprises a zinc diffusion area on each side of the red LED at the surface of said nitrogen-doped GaP epitaxial layer.

11. A composite LED display array as set forth in claim 2 wherein said light-absorbing doped region is characterized by zinc doping having a concentration greater than $10^{18}$ atoms/cc but less than $10^{20}$ atoms/cc.

12. A composite LED display array as set forth in claim 1 wherein said light-absorbing doped region extends through said substrate.

13. A composite LED display array as set forth in claim 1 wherein said doped region comprises a metal selected from atomic group II.

14. A composite LED display array as set forth in claim 13 wherein the group II metal is zinc and is doped to a concentration greater than $10^{18}$ atoms/cc.

15. A composite integrated circuit LED display array comprising:
    a light-transmissive planar substrate of a single III-V crystal carrying on the back side thereof of a plurality of optically isolated LED devices, the optical isolation being effected by a light-absorbing doped region between individual LED devices, said doped region being adapted to absorb light emitted by the individual LED devices, each of said LED devices being constituted by at least one diode having a separate p-n junction at which said light is radiated, said junction being at the back surface of said crystal, said light being transmitted through said crystal for being observed at the front surface of said crystal; and
    a planar integrated circuit array comprising memory and drive circuit elements corresponding to respective ones of said LED devices, said integrated circuit array being integrally joined to said light-transmissive substrate at the back side of said crystal, said memory circuit elements being selectively addressable to cause said drive circuit elements to independently energize the respective LED devices to emit light at said back surface, said light being transmitted through said substrate for being observed at the front surface of said substrate.

* * * * *

Disclaimer 3,947,840.—*Magnus George Craford*, St. Louis, and *Paul T. Bailey*, Creve Coeur, Mo. INTEGRATED SEMICONDUCTOR LIGHT-EMITTING DISPLAY ARRAY. Patent dated Mar. 30, 1976. Disclaimer filed Mar. 3, 1976, by the assignee, *Monsanto Company*.

The term of this patent subsequent to Feb. 24, 1993, has been disclaimed.

[*Official Gazette May 25, 1976.*]